US007825697B2

United States Patent
Hsiung et al.

(10) Patent No.: US 7,825,697 B2
(45) Date of Patent: Nov. 2, 2010

(54) SIGNAL DETECTION CIRCUIT WITH DEGLITCH AND METHOD THEREOF

(75) Inventors: Wen-Ching Hsiung, Hsinchu (TW); Kuan-Yu Chen, Hsinchu (TW); Jeng-Dau Chang, Tainan County (TW); Chia-Liang Lai, Changhua County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 334 days.

(21) Appl. No.: 12/040,094

(22) Filed: Feb. 29, 2008

(65) Prior Publication Data

US 2009/0219056 A1 Sep. 3, 2009

(51) Int. Cl.
*H03K 9/08* (2006.01)
(52) U.S. Cl. .............................. 327/34; 327/77; 327/58; 327/65
(58) Field of Classification Search .................... 327/33, 327/34, 72, 77, 78, 56, 58–62, 63, 65, 68
See application file for complete search history.

(56) References Cited

U.S. PATENT DOCUMENTS

| 4,101,789 | A | * | 7/1978 | Ruhnau | 327/72 |
| 5,736,875 | A | * | 4/1998 | Sakamoto et al. | 327/74 |
| 5,856,750 | A | * | 1/1999 | Koseki | 327/72 |
| 6,590,429 | B2 | * | 7/2003 | Choi et al. | 327/74 |

* cited by examiner

*Primary Examiner*—Lincoln Donovan
*Assistant Examiner*—Shikha Goyal
(74) *Attorney, Agent, or Firm*—Winston Hsu; Scott Margo; Min-Lee Teng

(57) ABSTRACT

A signal detection circuit is used for detecting signal squelch of a differential input signal to generate a corresponding digital output signal. The signal detection circuit includes: a reference voltage generator for generating a reference voltage of which the common mode voltage tracks the common mode voltage of the input signal; a real-time signal judgment circuit, real-time rectifying and amplifying a difference between the input signal and the reference voltage; and a deglitch circuit, sampling and/or amplifying an output signal of the real-time signal judgment circuit, and transforming sampling results into the digital output signal to reflect signal squelch of the differential input signal.

21 Claims, 9 Drawing Sheets

SIGNAL DETECTION CIRCUIT WITH DEGLITCH AND METHOD THEREOF

BACKGROUND OF THE INVENTION

1. Field of the Invention

The present invention relates to a signal detection circuit having a deglitch function, and a method thereof. More particularly, the present invention relates to a signal detection circuit for detecting signal squelch of a differential signal and for deglitch, and a method thereof.

2. Description of Related Art

In signal transceiving mechanism of serial link, a signal detector is generally allocated on the receiving side for detecting the differential input signal and judging whether the input signal is a required one and whether its amplitude is complied with a predefined signal specification according to a reference voltage.

Sometimes, the input signal received is greater than the reference voltage. Therefore, the signal detector is preferably to have a rectification function. Moreover, during the signal transition, the differential signal will be less than the reference voltage within a very short period of time, which may cause a glitch in the judgment of the signal squelch. In addition, noise may also cause a glitch.

FIG. 1 is a structural diagram of a conventional low voltage differential signal detector. Referring to FIG. 1, the signal detector 10 includes subtracters 11 and 12, a reference voltage generator 13, samplers 14 and 15, a clock generator 16, an OR logic gate 17, and a pulse stretcher 18.

The subtracters 11 and 12 subtract the reference voltage VREF (generated from the reference voltage generator 13) from the input signal IN, and output the result to the samplers 14 and 15. The samplers 14 and 15 sample output signals of the subtracters 11 and 12 according to a reference clock generated from the clock generator 16, and output the sampling results to the OR logic gate 17. The samplers 14 and 15 may amplify the output signal of the subtracters 11 and 12. The clock generator 16 may randomly generate a low frequency reference clock. Therefore, the sampling points of the samplers 14 and 15 are random.

The pulse stretcher 18 stretches the pulse width of the output signal of the OR logic gate 17 to obtain an output signal OUT. Pulse width stretching helps following signal processing. In this conventional circuit, the samplers 14 and 15 and the OR logic gate 17 may achieve a full-wave rectification effect.

However, the samplers 14 and 15 must have a high gain for improving the common mode noise rejection capability of the conventional circuit. Moreover, the conventional circuit does not have a function of deglitch.

Therefore, a signal detection circuit for detecting differential signals is required to overcome the shortages of conventional circuits and provide some other advantages.

SUMMARY OF THE INVENTION

The present invention is direct to a signal detection circuit for detecting signal squelch of a differential input signal by determining whether the differential input signal complies with a predefined signal specification. The signal detection circuit has functions of deglitch, better common mode noise rejection capability and better judgment accuracy.

According to an example of the present invention, a signal detection circuit for detecting signal squelch of a differential input signal is provided. The signal detecting circuit includes a reference voltage generator for generating a reference voltage of which the common mode voltage tracks the common mode voltage of the input signal; a real-time signal judgment circuit, for real-time full-wave rectifying and amplifying a difference between the input signal and the reference voltage, and judging whether the input signal is greater than the reference voltage, wherein the real-time signal judgment circuit includes a dual input differential comparator and an XOR logic gate, for comparing the differential input signal with the reference voltage; and a deglitch circuit, coupled to the real-time signal judgment circuit, deglitching by over-sampling and logic processing. The deglitch circuit includes an analog part and a digital part, wherein the analog part samples and/or amplifies an output signal of the real-time signal judgment circuit, and the digital part transforms sampling result of the analog part into a digital output signal. The digital output signal indicates whether the input signal is a required one, i.e. reflects signal squelch of the input signal.

According to another example of the present invention, a signal detection method for detecting differential input signal is provided. The method includes: generating a reference voltage of which the common mode voltage tracks the common mode voltage of the input signal; inverting the input signal to generate an inverted signal of the input signal; comparing the input signal with the reference voltage to generate a first comparison result; comparing the inverted signal of the input signal with the reference voltage to generate a second comparison result; performing an XOR logic operation on the first and second comparison results to generate a XOR logic operation result; sampling and/or amplifying the XOR logic operation result; and transforming the sampling result into a digital output signal, wherein the digital output signal indicates whether the input signal is a required one and reflects signal squelch of the differential input signal.

According to a further aspect of the present invention, a signal detection method for detecting signal squelch of an input signal and for providing a corresponding output signal is provided. The signal level of the output signal reflects a signal squelch of the input signal. The method includes: detecting whether the input signal is beyond a predefined reference range and providing a comparing signal to represent the comparison result; sampling the comparing signal and performing logic operation on the sampling results on different timing to filtrate the errors of sampling on the signal crossing points and to improve correctness of squelch signal outputting.

In order to make the aforementioned and other objects, features and advantages of the present invention comprehensible, a preferred embodiment accompanied with figures is described in detail below.

DESCRIPTION OF EMBODIMENTS

Figure 1:
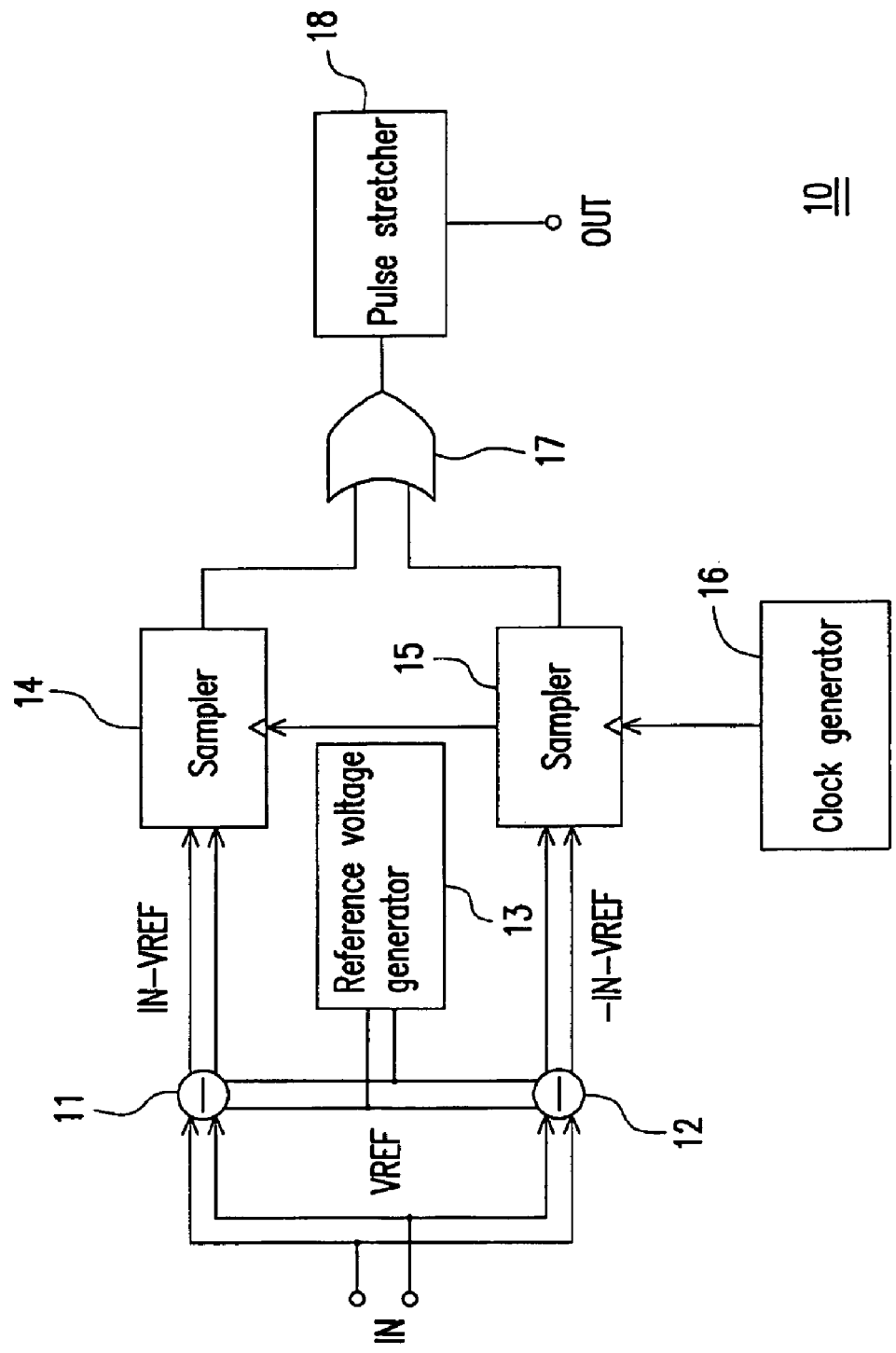
FIG. 1 is structural diagram of a conventional low voltage differential signal detector.
Figure 2:
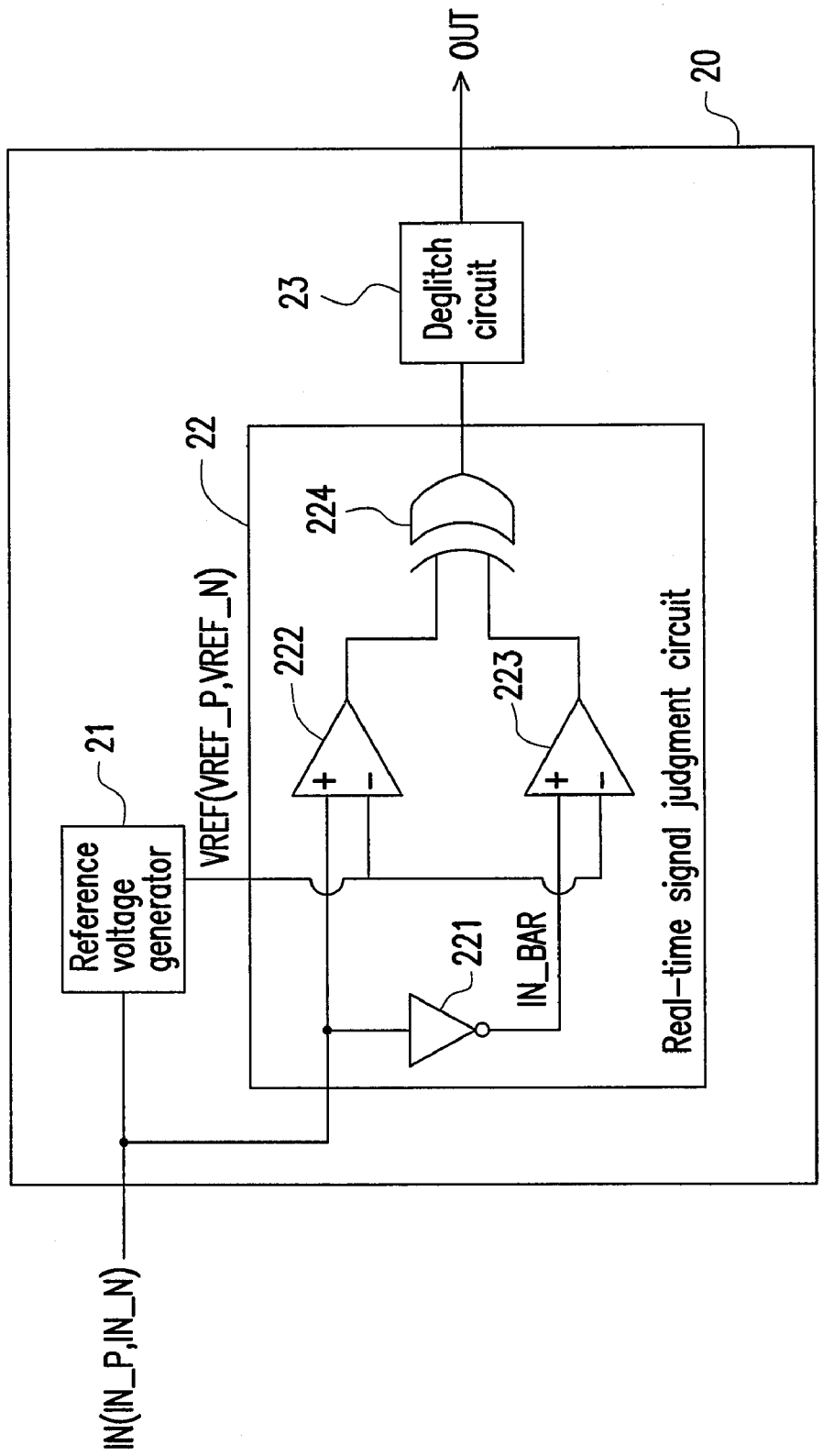
FIG. 2 is a circuit diagram of a low voltage differential signal detector according to an embodiment of the present invention.

FIG. 2 is a signal detection circuit according to an embodiment of the present invention. The signal detection circuit may detect signal squelch of the input signal IN and reflect it on the output signal OUT. The signal detection circuit of the embodiment has functions of deglitch, better common mode noise rejection and judgment errors avoid. Further, the signal detection circuit does not require high gain sampler with high cost.

Referring to FIG. 2, the signal detection circuit 20 includes a reference voltage generator 21, a real-time signal judgment circuit 22 and a deglitch circuit 23. The real-time signal judgment circuit 22 includes an inverter 221, comparators 222 and 223, and an XOR logic gate 224. The comparators 222 and 223 may form a dual input differential comparator.

The reference voltage generator 21 generates a reference voltage VREF (which is also a differential signal) according to an input signal IN. The input signal IN is a differential signal including signals IN_P and IN_N. The reference voltage VREF is also a differential signal including reference voltages VREF_P and VREF_N. The common mode voltage of the reference voltage VREF tracks the common mode voltage of the input signal IN.

Figure 3:
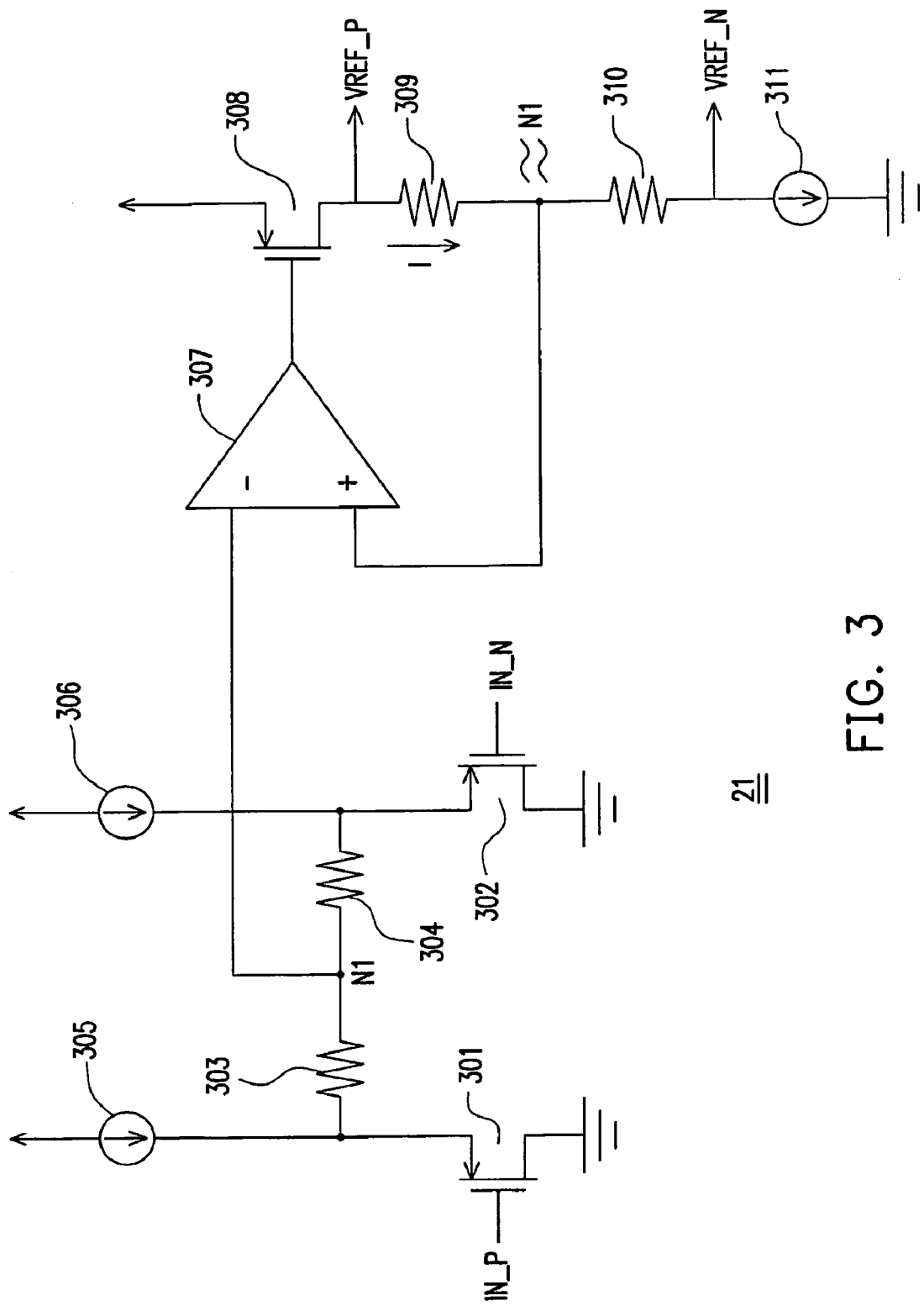
FIG. 3 is an example of a reference voltage generator according to the embodiment of the present invention.

FIG. 3 is an example of the reference voltage generator 21. Referring to FIG. 3, the reference voltage generator 21 includes transistors 301, 302 and 308, resistors 303, 304, 309 and 310, current sources 305, 306 and 311, and an amplifier 307. The connections of these components are shown in FIG. 3, and the detail description will be omitted hereby. The resistors 303 and 304 preferably have the same resistance (match with each other); similarly, the resistors 309 and 310 preferably have the same resistance (match with each other).

The transistors 301 and 302 and the resistors 303 and 304 may form a level shifter to slightly pull up the voltage level of the low voltage input signal IN from for example about 0V to about 1.5V. The amplifier 307 preferably has a high gain value.

Referring to FIG. 3, the reference voltages VREF_P and VREF_N may be approximately represented by:

$$VREF\_P \approx N1 + I*R \quad (1)$$

$$VREF\_N \approx N1 - I*R \quad (2)$$

wherein N1 represents the node voltage, R represents the resistance of the resistors 309 and 310, and I represents current flowed through the resistors 309 and 310.

The real-time signal judgment circuit 22 may full-wave rectify and amplify signals in real-time, and judge whether the input signal IN is greater than the reference voltage VREF. The real-time signal judgment circuit 22 further has a function of detecting signal squelch.

Referring to FIG. 2 again, the inverter 221 inverts the input signal IN into an inverted signal IN_BAR. The comparator 222 compares the input signal IN with the reference voltage VREF, and the comparator 223 compares the inverted signal IN_BAR with the reference voltage VREF.

Figure 4:
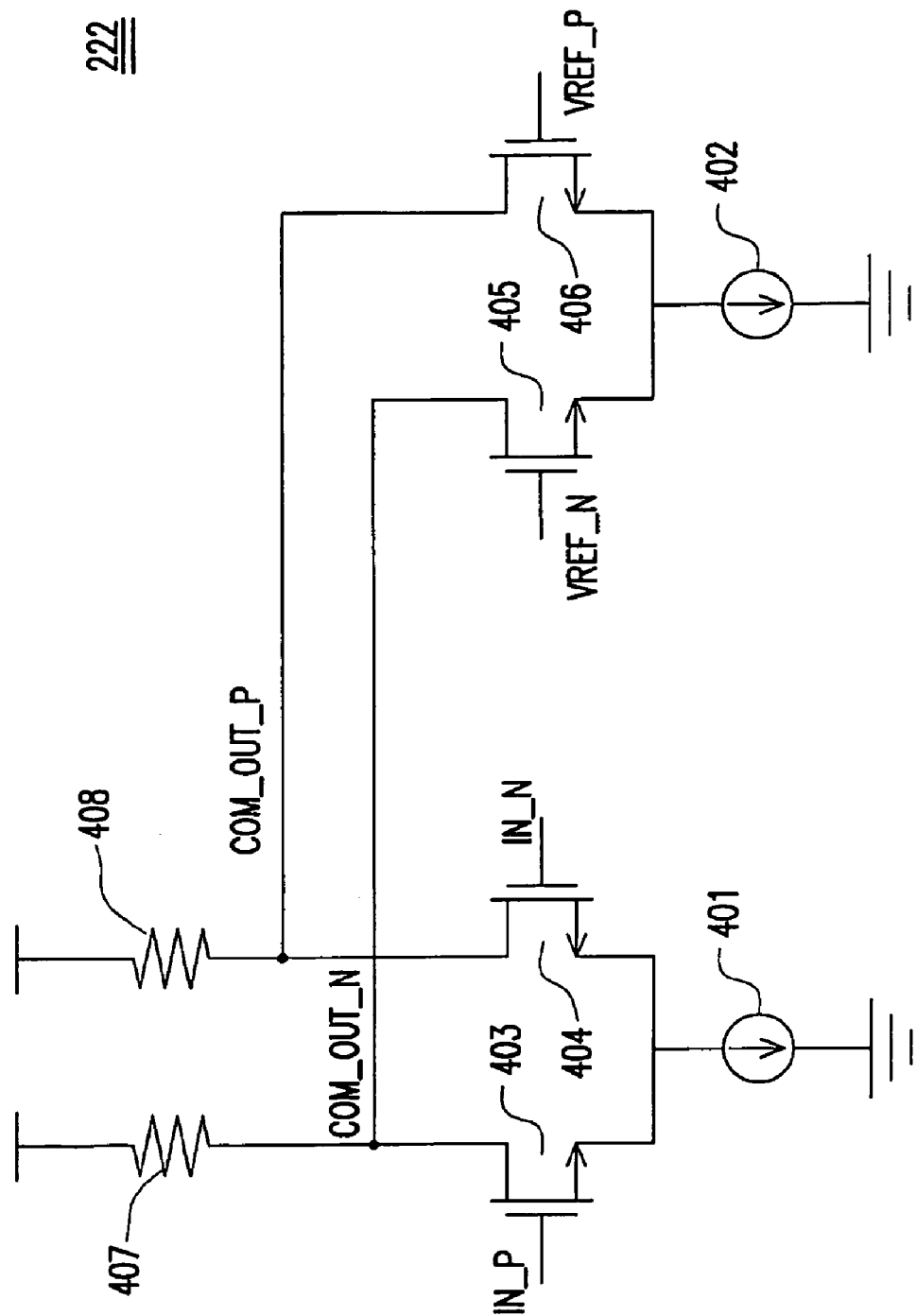
FIG. 4 is an example of a differential comparator according to the embodiment of the present invention.

FIG. 4 is a circuit diagram of the differential comparator 222. Referring to FIG. 4, the comparator 222 includes current sources 401 and 402, transistors 403~406, and resistors 407 and 408. The signals COM_OUT_P and COM_OUT_N are comparison result of the comparator 222. The connections of these components are shown in FIG. 4, and the detail description will be omitted hereby. Certainly, the structure of comparator 223 is similar or same to that of the comparator 222.

The XOR logic gate 224 receives the outputs of comparators 222 and 223, and performs an XOR logic operation. In the present embodiment, the XOR logic gate 224 may be a symmetrical differential analog structure having better common mode noise rejection capability, compared with the non-symmetrical differential structure.

Figure 5:
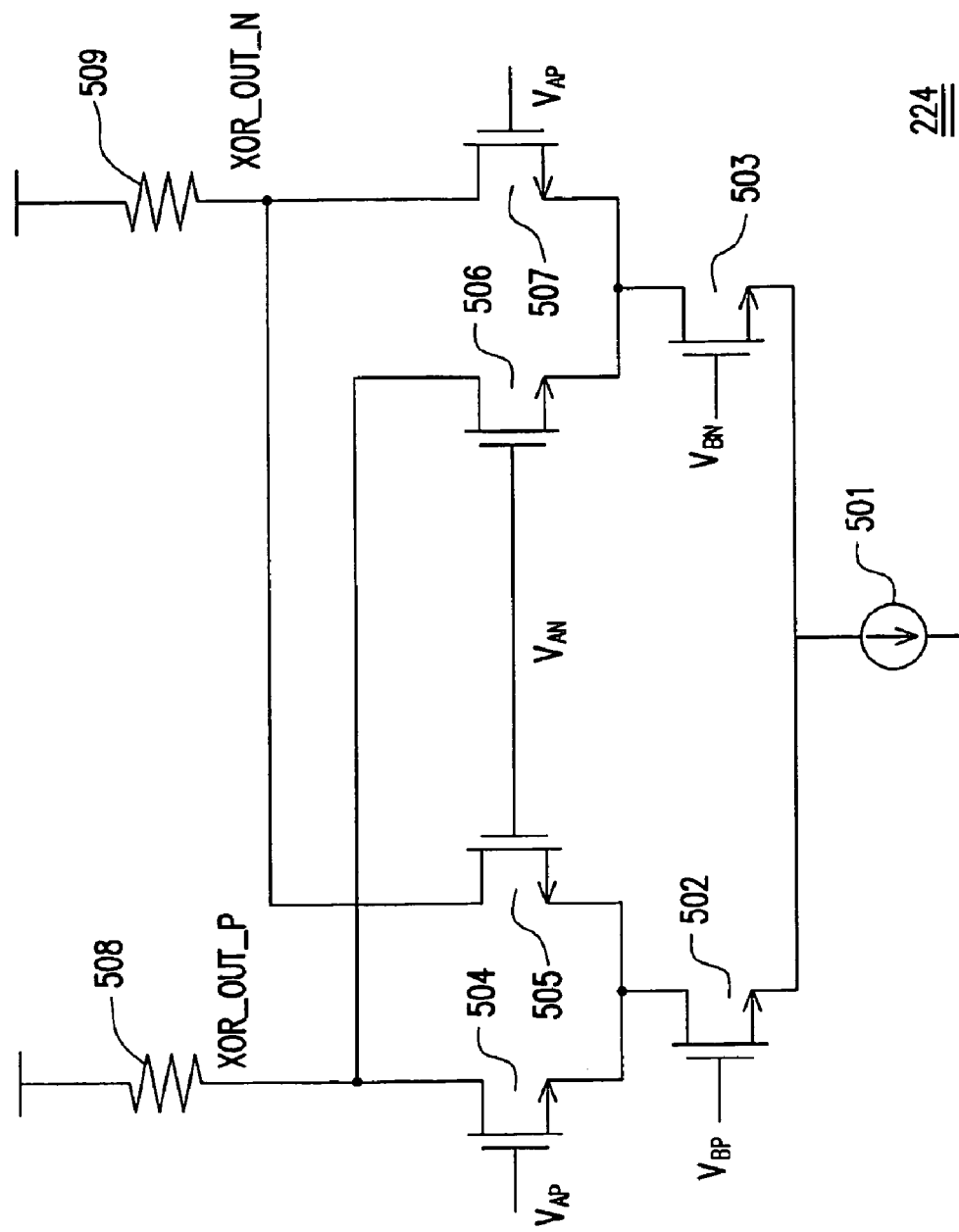
FIG. 5 is an example of a symmetrical differential XOR logic gate according to the embodiment of the present invention.

FIG. 5 is a circuit diagram of the symmetrical differential analog XOR logic gate 224. Referring to FIG. 5, the XOR logic gate 224 includes a current source 501, transistors 502~507, and resistors 508 and 509. The connections of these components are shown in FIG. 5, and the detail description will be omitted hereby.

In FIG. 5, the reference symbols VAN and VAP represent input signals (e.g. output signal of the comparator 222), the reference symbols VBN and VBP represent other input signals (e.g. output signal of the comparator 223), XOR_OUT_P and XOR_OUT_N are output signals of the XOR logic gate 224.

The comparators 222/223 and the XOR logic gate 224 may have a full-wave rectification and amplification effect to assist the judgment of whether the input signal being greater than the reference voltage, and to improve the detection accuracy.

Figure 6A:
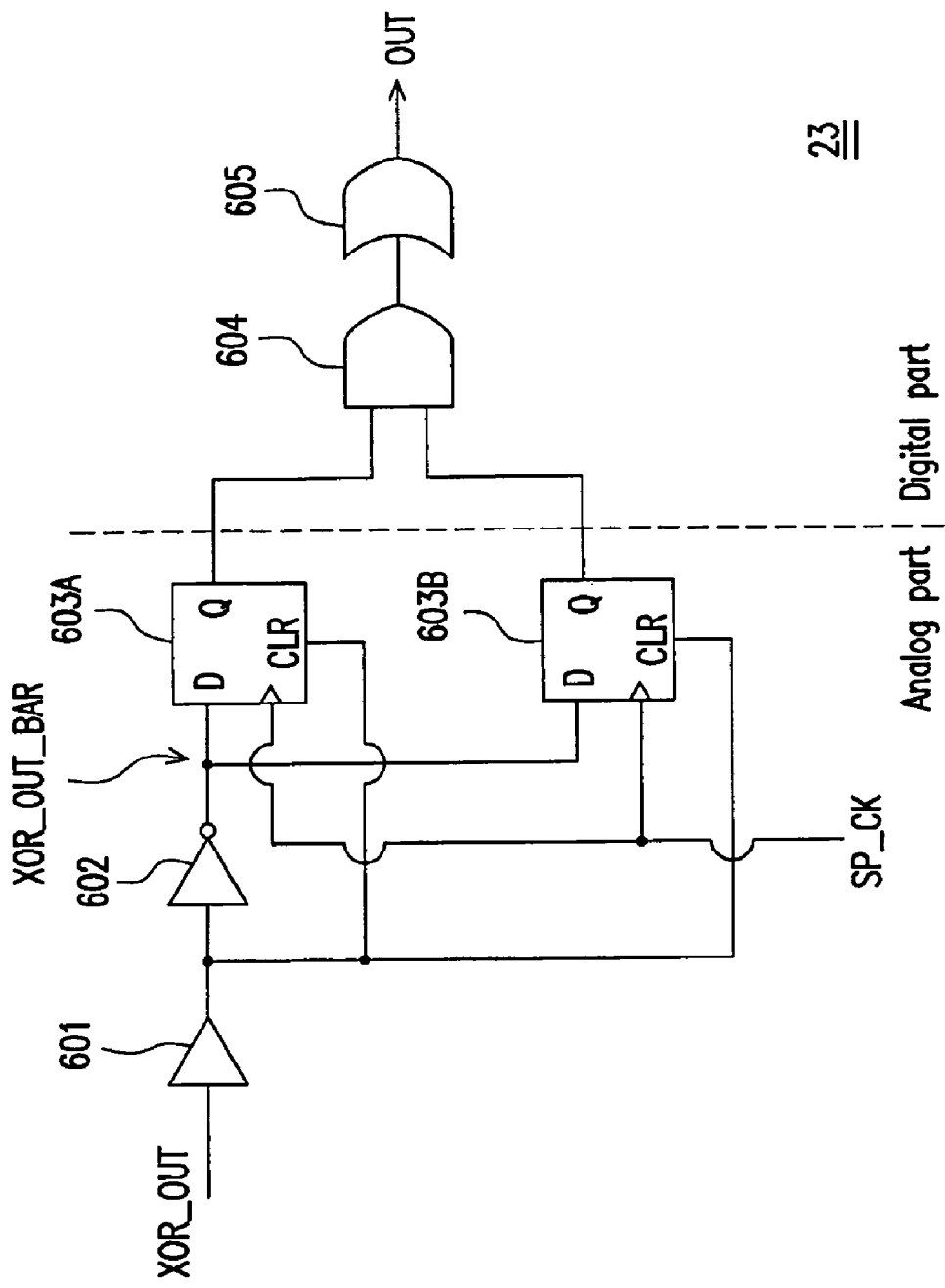
FIGS. 6A and 6B are two examples of a deglitch circuit according to the embodiment of the present invention.
Figure 6B:
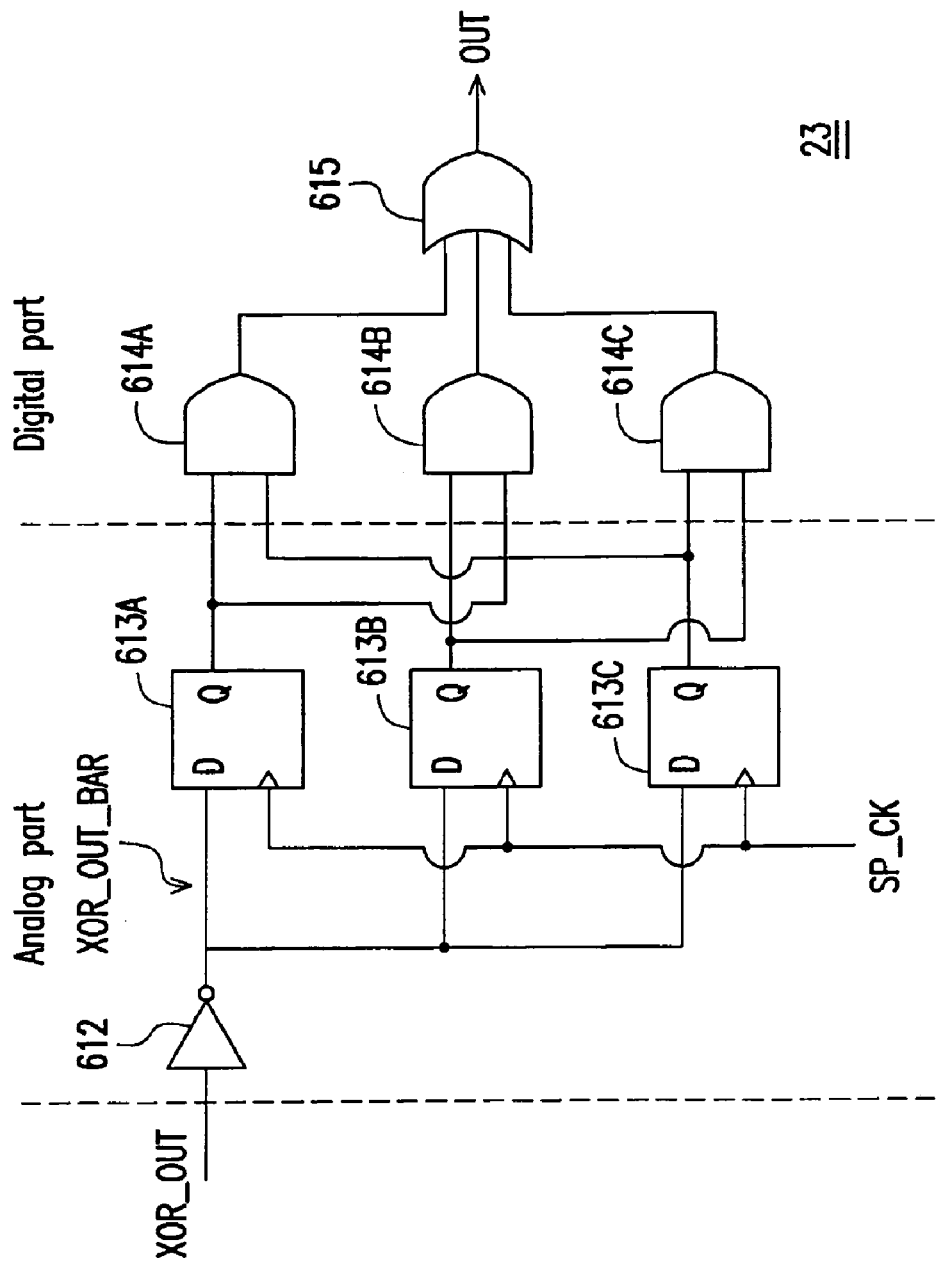

The deglitch circuit 23 implements the deglitch by multi sampling and logic processing. FIGS. 6A and 6B are two examples of the deglitch circuit 23. The deglitch circuit 23 includes an analog part and a digital part. The analog part of the deglitch circuit 23, which is also referred to as a sampling part may amplify and sampling signals. The digital part of the deglitch circuit 23 transforms the sampling result into a digital logic signal OUT for reflecting signal squelch of the differential input signal IN.

Referring to FIG. 6A, the deglitch circuit 23 includes a buffer 601, an inverter 602, latches 603A and 603B, an AND logic gate 604, and an OR logic gate 605. The connections of these components are shown in FIG. 6A, and the detail description will be omitted hereby. In this embodiment, the analog part of the deglitch circuit 23 includes the buffer 601, the inverter 602, and the latches 603A and 603B. The digital part of the deglitch circuit 23 includes the AND logic gate 604 and the OR logic gate 605.

The buffer 601 may further amplify the output signal XOR_OUT of the XOR logic gate 224. The inverter 602 inverts the amplified signal XOR_OUT into a signal XOR_OUT_BAR.

The output signal of the buffer 601 is transmitted to the reset terminal CLR of the latches 603A and 603B to reset the latches. When the input signal is greater than the reference voltage, and the difference between the input signal and the reference voltage is greater than a predefined value, the latches are reset.

The signal XOR_OUT_BAR is transmitted to data terminals D of the latches 603A and 603B. The sampling clock SP_CK is transmitted to control terminals of the latches 603A and 603B. The latches 603A and 603B sample the signal XOR_OUT_BAR according to the sampling clock SP_CK. To improve the sampling correctness for the embodiment of FIG. 6A, at least two samplings are preferably performed within one clock cycle of the input signal IN, i.e. over-sampling, namely, the frequency of the sampling clock SP_CK is at least two times of that of the input signal IN.

The sampling results of the latches 603A and 603B are transmitted to the AND logic gate 604. The OR logic gate 605 receives the output signal of the AND logic gate 604 and outputs the output signal OUT of the signal detection circuit.

Referring to FIG. 6B, the deglitch circuit 23 includes an inverter 612, latches 613A, 613B and 613C, AND logic gates 614A, 614B and 614C, and an OR logic gate 615. The connections of these components are shown in FIG. 6B, and the detail description will be omitted hereby. In this embodiment, the analog part of the deglitch circuit 23 includes the inverter 612, the latches 613A, 613B and 613C. The digital part of the deglitch circuit 23 includes the AND logic gates 614A, 614B and 614C, and the OR logic gate 615.

The operations of the inverter and the latches of FIG. 6B are similar to those of the inverter and the latches of FIG. 6A, and the description will be omitted hereby. However, in FIG. 6B, the signal XOR_OUT is not required to be used as a reset signal of the latches. To increase the sampling correctness for the embodiment of FIG. 6B, at least three samplings are preferably performed within one clock cycle of the input signal IN, namely, the frequency of the sampling clock SP_CK is at least three times of that of the input signal IN.

The input terminals of the AND logic gate 614A, 614B and 614C respectively receives the output signals from two of the latches. For example, the AND logic gate 614A receives the output signals of the latches 613A and 613C; the AND logic gate 614B receives the output signals of the latches 613A and 613B; the AND logic gate 614C receives the output signals of the latches 613B and 613C. The output signals of the AND logic gate 614A, 614B and 614C are all transmitted to the OR logic gate 615.

Figure 7A:
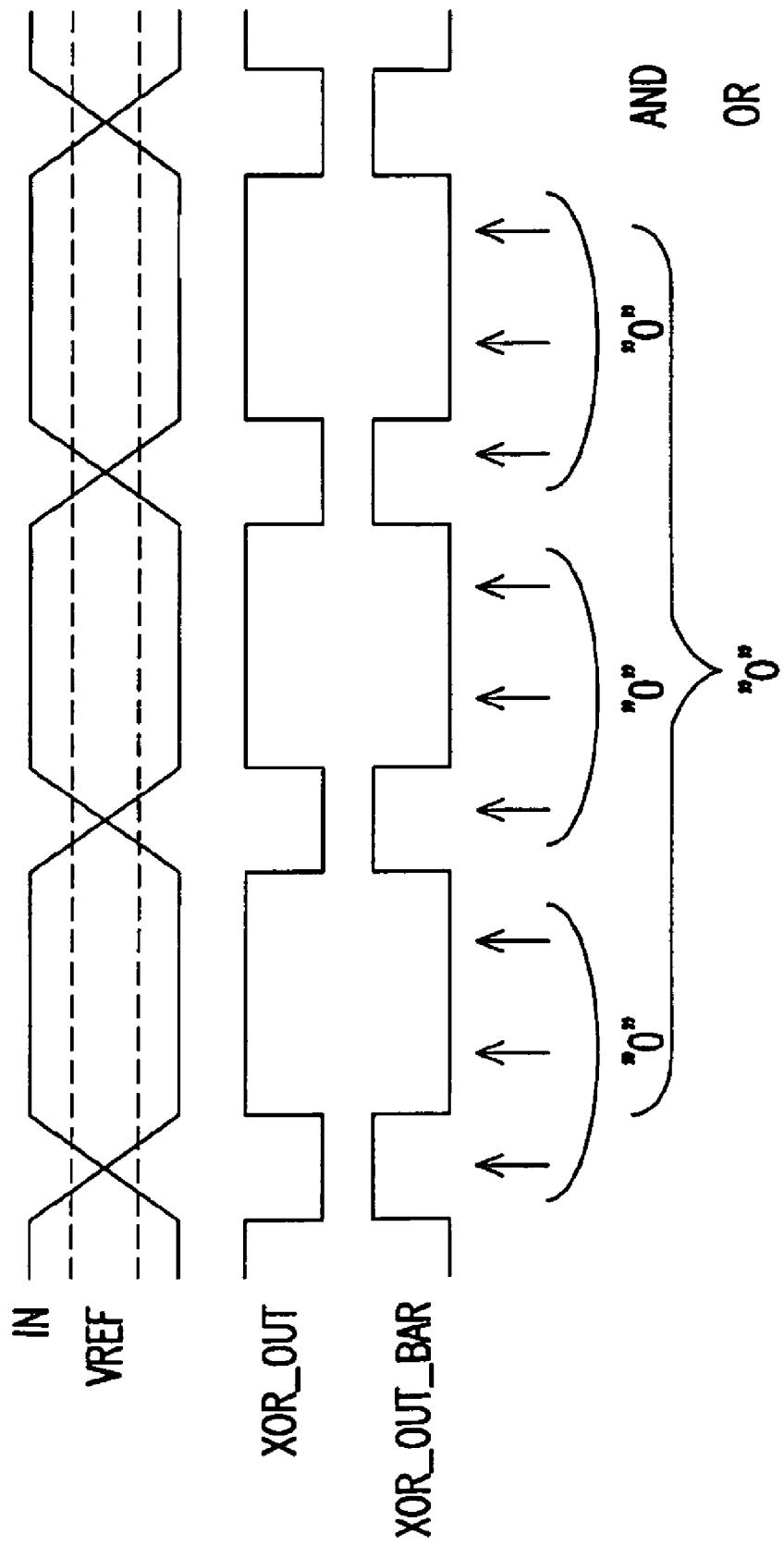
FIGS. 7A and 7B are schematic diagrams illustrating glitch elimination in the embodiment.
Figure 7B:
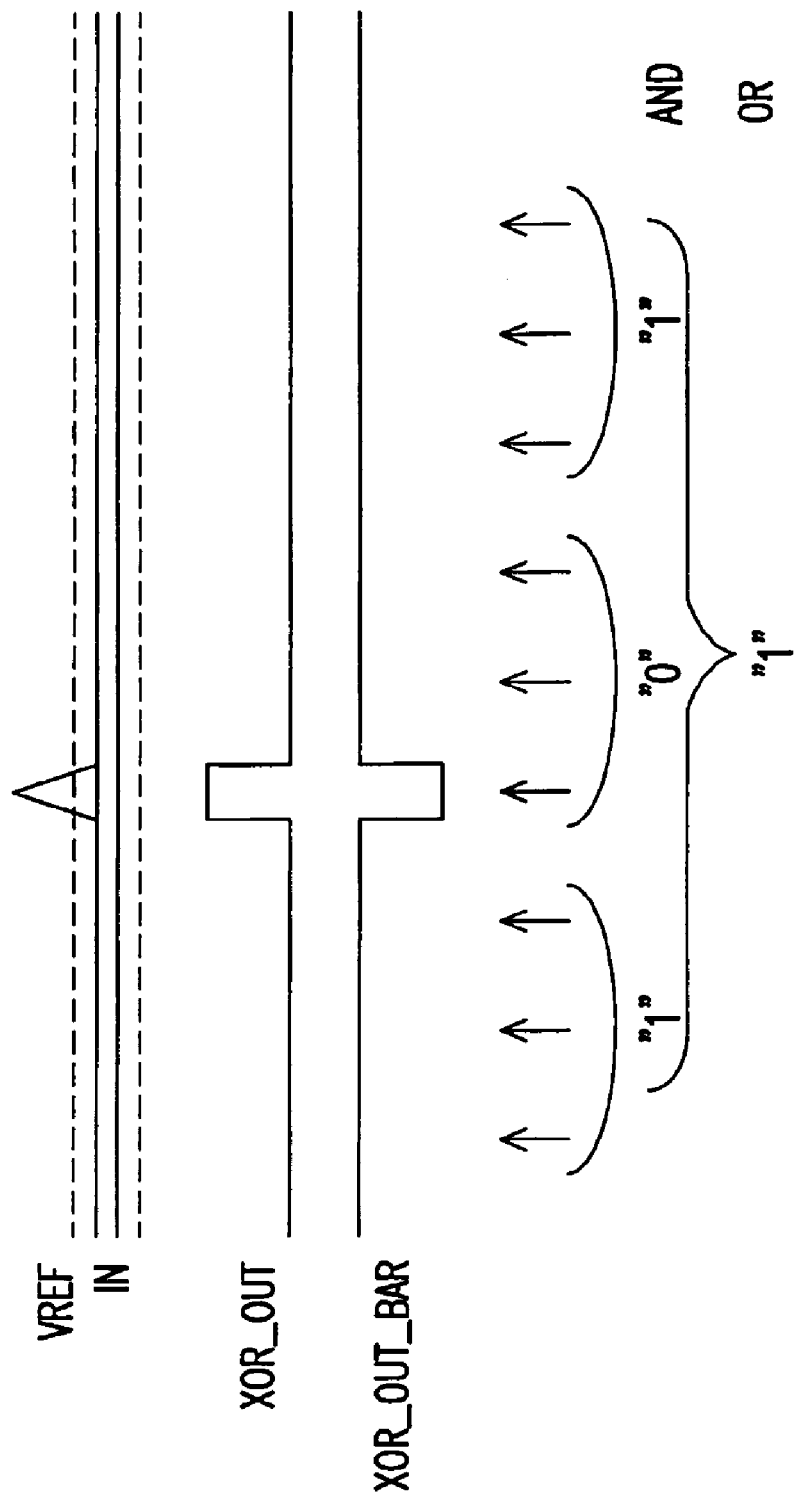

If signal sampling is performed during signal transition, a glitch in the output signal OUT is occurred and the judgment of the signal squelch is negatively influenced. Moreover, the noise occasionally occurred during transmission may also cause a glitch in the output signal. FIGS. 7A and 7B are schematic diagrams illustrating glitch elimination in the embodiment. In FIGS. 7A and 7B, arrows "↑" represent the sampling points, the solid lines represent the input signal IN, and the dash lines represent the reference voltage VREF.

FIG. 7A is a schematic diagram illustrating a sampling process during normal transmission of an input signal. When the signal XOR_OUT_BAR is sampled, the sampling point may be on signal transition, which will cause some of the sampling results are logic "1". The AND logic operation may eliminate the glitch occurred during signal transition. Referring to FIG. 7A, during normal transmission of the input signal IN, the output signal should be logic "0", which is not influenced by neither the sampling position nor by the signal transition of the input signal.

FIG. 7B is a diagram illustrating glitch elimination occasionally occurred during transmission. Even if there is no signal transmitted, a glitch is still possibly occurred during transmission. If some glitches are greater than the reference voltage and are sampled, which be eliminated by the OR logic operation, errors are prevented. Referring to FIG. 7B, when there is no signal transmission of the input signal IN, the output signal OUT should be "1", and the output signal maintains "1" even if there is a glitch during transmission.

In the present embodiment, the sampling part may have a relatively lower differential gain than that of a conventional technique. Moreover, the comparator, the XOR logic gate and the sampling part (the analog part) of the deglitch circuit are all differential analog circuits having gains. The low voltage output signal of the comparator after being analog differential amplified is sampled as a digital logic signal, so as to avoid the judgment errors. The differential analog circuits may effectively avoid the interference of the common mode noise.

In another aspect, a signal squelch of the input signal IN can be detected in the present embodiment, and the signal level of the output signal OUT reflects the signal squelch of the input signal IN. First, detecting whether the input signal IN is beyond a predefined referential range, and providing a comparison result. Next, sampling the comparison result and performing logic operation on the sampling results on different timing to adjust the signal level of the output signal OUT, so as to filtrate the errors of sampling on the signal crossing points and to improve correctness of squelch signal outputting.

The structure of present embodiment is suitable for high-speed serial link systems and universal serial bus (USB) systems.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal detection circuit for detecting signal squelch of an input signal, wherein the input signal is a differential signal, the signal detection circuit comprising:
   a reference voltage generator, for generating a reference voltage according to the input signal, wherein the reference voltage is a differential signal, and the common mode voltage of the reference voltage tracks the common mode voltage of the input signal;
   a real-time signal judgment circuit, for full-wave rectifying and amplifying a difference between the input signal and the reference voltage in real-time, and for judging whether the input signal is greater than the reference voltage, the real-time signal judgment circuit including a dual input differential comparator and an XOR logic gate, for comparing a voltage different between two sub-signals of the input signal with a voltage different between two sub-signals of the reference voltage; and
   a deglitch circuit, coupled to the real-time signal judgment circuit, deglitching glitches by over-sampling and logic processing, the deglitch circuit including an analog part and a digital part, wherein the analog part of the deglitch circuit samples and/or amplifies an output signal of the real-time signal judgment circuit, the digital part of the deglitch circuit transforms the sampling result of the analog part into a digital output signal of the signal detection circuit to reflect signal squelch of the input signal.

2. The signal detection circuit as claimed in claim 1, wherein the real-time signal judgment circuit further comprises:
   a first inverter, for inverting the input signal to generate an inverted signal of the input signal.

3. The signal detection circuit as claimed in claim 2, wherein the dual input differential comparator of the real-time signal judgment circuit comprises:
   a first comparator, having a first input terminal for receiving the input signal, a second input terminal for receiving the reference voltage, and an output terminal; and
   a second comparator, having a first input terminal for receiving the inverted signal of the input signal, a second terminal for receiving the reference voltage, and an output terminal,
   wherein the first and the second comparators are differential analog amplifiers.

4. The signal detection circuit as claimed in claim 3, wherein the XOR logic gate of the real-time signal judgment circuit comprises:

a first input terminal, coupled to the output terminal of the first comparator; a second input terminal, coupled to the output terminal of the second comparator; and an output terminal for outputting the output signal of the real-time signal judgment circuit, wherein the XOR logic gate is a symmetrical differential analog logic gate.

5. The signal detection circuit as claimed in claim 1, wherein the analog part of the deglitch circuit comprises:
   a buffer, having an input terminal for receiving the output signal of the real-time signal judgment circuit, and an output terminal;
   a second inverter, having an input terminal coupled to the output terminal of the buffer, and an output terminal;
   a first latch, having a data terminal coupled to the output terminal of the second inverter, a control terminal for receiving a sampling clock, a reset terminal coupled to the output terminal of the buffer, and an output terminal; and
   a second latch, having a data terminal coupled to the output terminal of the second inverter, a control terminal for receiving the sampling clock, a reset terminal coupled to the output terminal of the buffer, and an output terminal.

6. The signal detection circuit as claimed in claim 5, wherein the digital part of the deglitch circuit comprises:
   a first AND logic gate, having a first input terminal coupled to the output terminal of the first latch, a second input terminal coupled to the output terminal of the second latch, and an output terminal; and
   a first OR logic gate, having an input terminal coupled to the output terminal of the first AND logic gate, and an output terminal for outputting the digital output signal of the signal detection circuit.

7. The signal detection circuit as claimed in claim 5, wherein the frequency of the sampling clock is at least two times of that of the input signal.

8. The signal detection circuit as claimed in claim 1, wherein the analog part of the deglitch circuit comprises:
   a third inverter, having an input terminal for receiving the output signal of the real-time signal judgment circuit, and an output terminal;
   a third latch, having a data terminal coupled to the output terminal of the third inverter, a control terminal for receiving a sampling clock, and an output terminal;
   a fourth latch, having a data terminal coupled to the output terminal of the third inverter, a control terminal for receiving the sampling clock, and an output terminal; and
   a fifth latch, having a data terminal coupled to the output terminal of the third inverter, a control terminal for receiving the sampling clock, and an output terminal.

9. The signal detection circuit as claimed in claim 8, wherein the digital part of the deglitch circuit comprises:
   a second AND logic gate, having a first input terminal coupled to the output terminal of the third latch, a second input terminal coupled to the output terminal of the fifth latch, and an output terminal;
   a third AND logic gate, having a first input terminal coupled to the output terminal of the third latch, a second input terminal coupled to the output terminal of the fourth latch, and an output terminal;
   a fourth AND logic gate, having a first input terminal coupled to the output terminal of the fourth latch, a second input terminal coupled to the output terminal of the fifth latch, and an output terminal; and
   a second OR logic gate, having an input terminal coupled to the output terminal of the second AND logic gate, a second input terminal coupled to the output terminal of the third AND logic gate, a third input terminal coupled to the output terminal of the fourth AND logic gate, and an output terminal for outputting the digital output signal of the signal detection circuit.

10. The signal detection circuit as claimed in claim 8, wherein the frequency of the sampling clock is at least three times of that of the input signal.

11. A signal detection method, for detecting signal squelch of an input signal, wherein the input signal is a differential signal, the signal detection method comprising:
    generating a reference voltage according to the input signal, wherein the reference voltage is a differential signal and the common mode voltage of the reference voltage tracks the common mode voltage of the input signal;
    inverting the input signal to generate an inverted signal of the input signal, wherein the inverted signal of the input signal is a different signal;
    comparing a voltage difference between two sub-signals of the input signal with a voltage difference between two sub-signals of the reference voltage to generate a first comparison result;
    comparing a voltage difference between two sub-signals of the inverted signal of the input signal with the voltage difference between the two sub-signals of the reference voltage to generate a second comparison result;
    performing an XOR logic operation on the first and the second comparison results to generate a first XOR logic operation result;
    sampling and/or amplifying the first XOR logic operation result; and
    transforming the sampling result into a digital output signal, the digital output signal for indicating whether the input signal is a required one and for reflecting signal squelch of the input signal.

12. The signal detection method as claimed in claim 11, wherein the step of comparing the voltage difference of the input signal with the voltage difference of the reference voltage comprises:
    using a differential analog amplifier to compare the voltage difference of the input signal with the voltage difference of the reference voltage.

13. The signal detection method as claimed in claim 11, wherein the step of comparing the voltage difference of the inverted signal of the input signal with the voltage difference of the reference voltage comprises:
    using a differential analog amplifier to compare the voltage difference of the inverted signal of the input signal with the voltage difference of the reference voltage.

14. The signal detection method as claimed in claim 11, wherein the step of performing the XOR logic operation comprises:
    using a symmetrical differential analog XOR logic gate to perform the XOR logic operation.

15. The signal detection method as claimed in claim 11, wherein the steps of sampling and/or amplifying the first XOR logic operation result comprise:
    amplifying and inverting the first XOR logic operation result to generate a second XOR logic operation result;
    performing a first over-sampling on the second XOR logic operation result according to a sampling clock; and
    performing a second over-sampling on the second XOR logic operation result according to the sampling clock.

16. The signal detection method as claimed in claim 11, wherein the step of transforming the sampling result into the digital output signal comprises:

performing an AND logic operation and an OR logic operation on the first and the second over-sampling results to obtain the digital output signal.

17. The signal detection method as claimed in claim 15, wherein the frequency of the sampling clock is at least two times of that of the input signal.

18. The signal detection method as claimed in claim 11, wherein the steps of sampling and/or amplifying the first XOR logic operation result comprise:
  inverting the first XOR logic operation result to generate a second XOR logic operation result;
  performing a third over-sampling on the second XOR logic operation result according to a sampling clock;
  performing a fourth over-sampling on the second XOR logic operation result according to the sampling clock; and
  performing a fifth over-sampling on the second XOR logic operation result according to the sampling clock.

19. The signal detection method as claimed in claim 18, wherein the step of transforming the sampling result into the digital output signal comprises:

performing an AND logic operation and an OR logic operation on the third, the fourth and the fifth over-sampling results to obtain the digital output signal.

20. The signal detection method as claimed in claim 18, wherein the frequency of the sampling clock is at least three times of that of the input signal.

21. A signal detection method, for detecting signal squelch of an input signal and for providing a corresponding output signal, wherein the signal level of the output signal reflects signal squelch of the input signal, the method comprising:
  detecting whether the input signal is beyond a predefined reference range, and providing a comparing signal to represent the comparison result; and
  sampling the comparing signal and performing logic operation on the sampling results on different timing to adjust the signal level of the output signal, so as to filtrate errors of sampling on the signal crossing points and to improve correctness of squelch signal outputting, wherein the sampling frequency of the comparing signal is at least three time of that of the input signal.

* * * * *